United States Patent
Howlett et al.

(10) Patent No.: US 11,483,654 B2
(45) Date of Patent: Oct. 25, 2022

(54) DRIVER CIRCUITRY

(71) Applicant: Cirrus Logic International Semiconductor Ltd., Edinburgh (GB)

(72) Inventors: Andrew J. Howlett, Edinburgh (GB); Sharjeel Riaz, Edinburgh (GB); John P. Lesso, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 17/158,540

(22) Filed: Jan. 26, 2021

(65) Prior Publication Data

US 2021/0250685 A1 Aug. 12, 2021

Related U.S. Application Data

(60) Provisional application No. 62/972,348, filed on Feb. 10, 2020.

(30) Foreign Application Priority Data

Mar. 18, 2020 (GB) ...................................... 2003897

(51) Int. Cl.
*H04R 3/00* (2006.01)
*H03F 3/181* (2006.01)
*H04R 3/02* (2006.01)

(52) U.S. Cl.
CPC ............... *H04R 3/02* (2013.01); *H03F 3/181* (2013.01); *H03F 2200/03* (2013.01)

(58) Field of Classification Search
CPC ........ H04R 3/00; H04R 3/02; H04R 2203/00; H03F 3/181; H03F 3/187; H03F 3/005;
(Continued)

(56) References Cited

U.S. PATENT DOCUMENTS 5,226,000 A * 7/1993 Moses ..................... G06F 17/17
708/313
5,260,704 A 11/1993 Hustig et al.
(Continued)

FOREIGN PATENT DOCUMENTS

GB 2408859 A 6/2005

OTHER PUBLICATIONS

Combined Search and Examination Report under Sections 17 and 18(3), UKIPO, Application No. GB2003897.2, dated Sep. 18, 2020.
(Continued)

*Primary Examiner* — Thang V Tran
(74) *Attorney, Agent, or Firm* — Jackson Walker L.L.P.

(57) ABSTRACT

This application relates to driver circuitry (200) for receiving a digital input signal (D) and outputting, at first and second output nodes (203p, 203n), first and second analogue driving signals respectively for driving a transducer (101), e.g. loudspeaker, in a bridge-tied-load configuration. The driver circuitry may particularly be suitable for driving low-impedance transducers. The driver circuitry has first and second digital-to-analogue converters (201p, 201n) configured to receive the digital input signal and the outputs of the first and second digital-to-analogue converters are coupled to the first and second output nodes respectively. A differential-output amplifier circuit (202) has outputs connected to the first and second output nodes and is configured to regulate the outputs of the digital-to-analogue converters at output nodes to provide the analogue driving signals.

16 Claims, 4 Drawing Sheets

(58) Field of Classification Search
CPC .... H03F 3/45; H03F 3/45475; H03F 3/45941; H03F 2203/45–82; H03F 2203/45514; H03F 2203/45394; H03F 2203/45066; H03M 1/44; H03M 1/66; H03M 1/72; H03M 1/442; H03M 1/804
See application file for complete search history.

(56) References Cited

U.S. PATENT DOCUMENTS

| | | | | |
|---|---|---|---|---|
| 6,147,522 | A * | 11/2000 | Rhode | H03M 3/368 327/93 |
| 6,573,850 | B1 * | 6/2003 | Pennock | H03M 3/368 341/150 |
| 6,952,176 | B2 * | 10/2005 | Frith | H03M 3/322 341/150 |
| 7,102,557 | B1 | 9/2006 | Frith | |
| 2005/0258994 | A1 | 11/2005 | Lilamwala | |
| 2010/0331048 | A1 * | 12/2010 | Xiang | H04S 5/00 381/1 |
| 2012/0326905 | A1 * | 12/2012 | Nezuka | H03M 3/464 341/143 |
| 2014/0167993 | A1 | 6/2014 | Chiang et al. | |

OTHER PUBLICATIONS

International Search Report and Written Opinion of the International Searching Authority, International Application No. PCT/GB2021/050224, dated Apr. 22, 2021.

Fujimori et al., A Multibit Delta-Sigma Audio DAC with 120-dB Dynamic Range, IEEE Journal of Solid-State Circuits, IEEE, USA, vol. 35, No. 8, Aug. 1, 2000.

* cited by examiner

DRIVER CIRCUITRY

FIELD OF DISCLOSURE

The field of representative embodiments of this disclosure relates to methods, apparatus and/or implementations concerning or relating to operation of driver circuitry, and especially to driver circuitry for driving transducers, such as loudspeakers, and in particular to driving relatively low-impedance transducers arranged as a bridge-tied-load.

BACKGROUND

There are a number of applications where it is desired to drive an output transducer, e.g. a load, with some signal content, for instance to drive a loudspeaker with an audio signal to generate sound. Typically, the audio signal content will be received or stored for playback in digital form and thus a playback path for driving a loudspeaker may include a digital-to-analogue converter (DAC), to convert the digital audio signal to analogue, and a suitable amplifier, to amplify the output of the DAC to generate a driving signal. In some applications, the loudspeaker, or more generally load, is connected in series between a terminal for receiving the driving signal and a terminal held at a fixed voltage, e.g. ground. In some applications, however, the loudspeaker may be arranged in a bridge-tied-load configuration, where the two terminals of the loudspeaker are each driven with a differential driving signal so as to apply a differential voltage across the bridge-tied-load, e.g. loudspeaker. Such a configuration may involve two audio driving paths for the loudspeaker, each involving a DAC and amplifier.

In some applications, size and/or power consumption of the driver circuitry may be important. For example, wireless earbuds or in-ear headphones are becoming popular. The size of such devices is limited by the need to fit and remain comfortable within a user's ear and thus the size of the internal components, such as the driver circuitry, can be important. To provide a good user experience the device should, in use, also offer a decent battery life before requiring charging and thus power consumption is also important, especially given the battery size will also be limited. For headphones or the like, the loudspeaker of the device may have a relatively low impedance, say of the order of 8-1000 ohms, and in some instance, e.g. for in-ear headphones or the like which may be relatively small the impedance may be 16 ohms or 32 ohms or so, and the driver circuitry should be capable of operating stably to drive such a relatively low-impedance load.

SUMMARY

Embodiments of the present disclosure are thus directed at driver circuitry, and operation thereof, suitable for driving a bridge-tied-load, for example a relatively low-impedance transducer such as a loudspeaker, that may offer advantages in terms of size and/or power consumption.

According to an aspect of the disclosure there is provided driver circuitry for receiving a digital input signal and outputting, at first and second output nodes, first and second analogue driving signals respectively for driving a bridge-tied-load. The driver circuitry comprises first and second digital-to-analogue converters configured to receive the digital input signal, wherein outputs of the first and second digital-to-analogue converters are coupled to the first and second output nodes respectively. A differential-output amplifier circuit has outputs connected to the first and second output nodes respectively, wherein the differential-output amplifier circuit is configured to regulate the outputs of first and second digital-to-analogue converters at the first and second output nodes to provide the first and second analogue driving signals.

In some examples the differential-output amplifier circuit may comprise first and second amplifiers with respective outputs coupled to the first and second output nodes respectively. A first input of the first amplifier and first input of the second amplifier may be coupled to a common-input node, the common input node being configured to receive a voltage based on a defined common-mode voltage.

The first and second digital-to-analogue converters may be connected across the respective first and second amplifiers between a second input of the respective first or second DAC amplifier and the output of the respective first or second DAC amplifier.

The common-input node may be coupled to receive the defined common-mode voltage. In some implementations the common input node may be coupled to the defined common-mode voltage via a series resistance.

In some examples, for each of the first and second amplifiers, there may be a feedback impedance in a feedback path from a tap node of a signal path of the relevant amplifier and the first input of the amplifier. The tap node of the signal path may be upstream of an output stage of the amplifier. The feedback impedance may comprise at least one reactive component and, in some examples, may comprise a capacitor.

In some implementations the driver circuitry may comprise a common-mode regulating amplifier having a first input coupled to receive the defined common-mode voltage, a second input coupled to receive an indication of the common-mode voltage at the first and second output nodes and an output coupled to the common input node.

The first and second digital-to-analogue converters may comprise switched capacitor direct-charge-transfer DACs.

The differential-output amplifier circuit may comprise a two-stage amplifier.

In some implementations, the first and second analogue driving signals are for driving a bridge-tied-load transducer with an impedance or 1000 ohms or less, or 650 ohms or less, or 200 ohms or less. In some implementations the first and second analogue driving signals are for driving a bridge-tied-load transducer with an impedance or 64 ohms or less.

The driver circuitry may be implemented as an integrated circuit.

Embodiments also relate to driver circuity further comprising a transducer load coupled in series between the first and second output nodes. The transducer load may be a loudspeaker. The driver circuitry may be configured so that there are no amplification stages in signal paths between the first and second output nodes and the transducer load.

Also provided is an electronic device comprising driver circuitry according to any of the variants discussed herein.

In another aspect there is provided circuitry for driving a transducer comprising:
 an amplifier comprising differential input terminals and differential output terminals for outputting a differential analogue output signal for driving the transducer; and
 a switched capacitor DAC arrangement comprising an input terminal for receiving a digital input signal,
wherein the switched capacitor DAC arrangement is operatively connected between the amplifier differential input terminals and the amplifier differential output terminals.

In another aspect there is provided circuitry for driving a transducer comprising: a differential amplifier for outputting a differential analogue output signal for driving the transducer; and a differential DAC connected in parallel with the amplifier.

In another aspect there is provided a differential amplifier for driving a transducer comprising a differential DAC connected in parallel with the differential amplifier.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to driver circuitry for providing output driving signals suitable for driving a bridge-tied-load, and in particular for driving low-impedance transducer loads, for example a low impedance loudspeaker. Loudspeakers used for headphones may have a range of different impedances, for example in the range of 8 to 1000 ohms depending on the type of headphone. Some headphones, for example some over-ear headphone, have loudspeakers with impedances of several hundred ohms, say up to around 600 ohms or so. Some headphones may have loudspeakers with impedances of a few tens of ohms, say around 32 ohms. Loudspeakers typically used in in-ear headphones or the like may have impedances in the range of 16-32 ohms or so.

As used herein the term low impedance, in respect of a transducer load, shall be taken to mean an impedance of 1000 ohms or less. At least some embodiments described herein may be capable of satisfactorily driving transducer loads with an impedance lower than 650 ohms. At least embodiments may be capable of satisfactorily driving transducer loads with an impedance lower than 200 ohms, or with an impedance of 64 ohms or less.

Figure 1A:
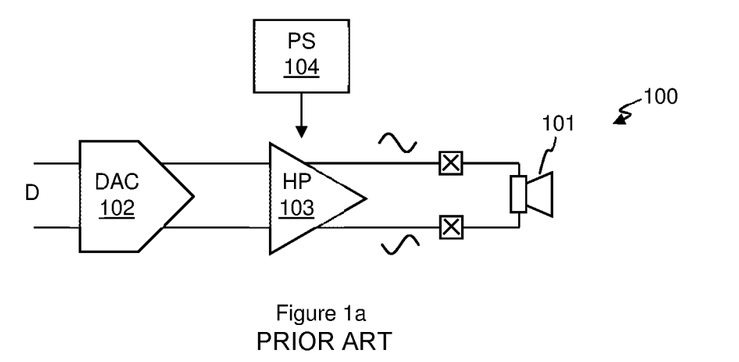
FIG. 1a illustrates an example of a conventional driver circuit and FIG. 1b illustrates elements of the driver circuit in more detail.

FIG. 1a illustrates one example of a conventional driver circuit 100 for driving a bridge-tied-load 101, which in this example is a loudspeaker. FIG. 1a illustrates a differential driver circuit having a differential-output digital-to-analogue converter (DAC) circuit 102 for receiving the digital input data D. The differential output from the DAC circuit 102 is then amplified by driver amplifier 103, which in this example is a headphone amplifier, to provide differential driving signals to the terminals of the bridge-tied-load 101. The DAC circuit 102 may be operable from a voltage supply which is received by the driver circuit, say a supply voltage of 1.8V or similar, but the differential headphone amplifier 103 may require greater supply voltages and thus the driver circuit 100 may also comprise an amplifier power supply 104, such as a charge pump or the like, to receive an input voltage and generate suitable amplifier supply voltages for the headphone amplifier 103.

Figure 1B:
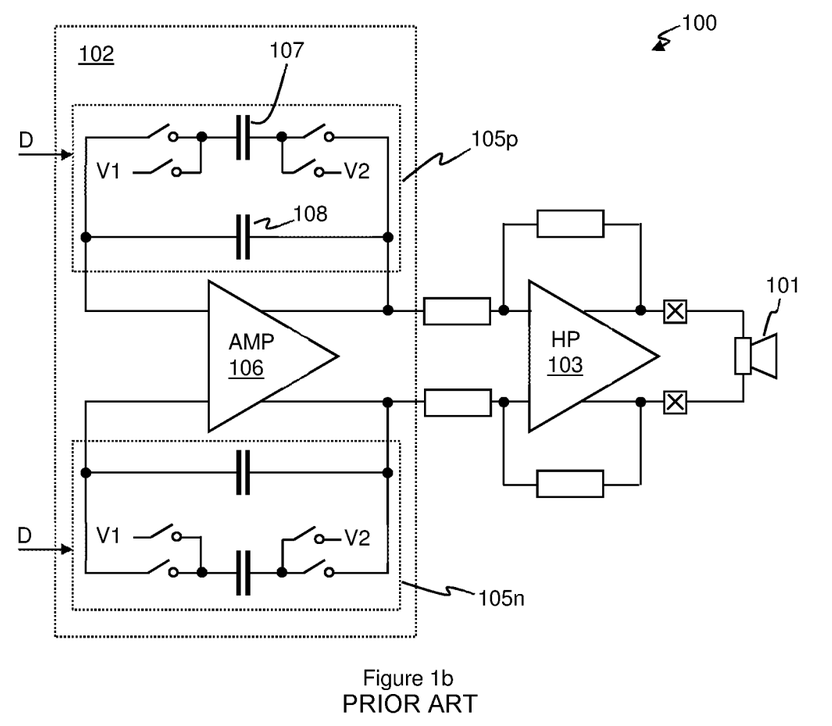

FIG. 1b illustrates some of the driver circuitry 100 in more detail, according to an example. FIG. 1b illustrates that the differential output DAC circuit 102 may be implemented by respective DACs 105p and 105n for the differential outputs, each of which is regulated by DAC amplifier 106. In this example the DACs 105p and 105n (which will be referred collectively or individually by the reference 105) are switched-capacitor direct charge transfer (DCT) DACs as would be understood by one skilled in the art, although it will be understood that other types of DAC could be implemented. During a sampling phase, a sampling capacitor 107 of the DAC 105, is configured to receive a voltage V1 at a first terminal and a voltage V2 at a second terminal, where the values of the voltages V1 and V2 for the respective sampling capacitors 107 are controlled based on the input data D, for instance by selectively coupling the relevant terminal to one of a number of different reference voltages. In a read-out phase the sampling capacitor 107 is connected in parallel with integrating capacitor 108 across DAC amplifier 106 to generate an output that depends on the input data value. Note that FIG. 1b shows a DAC 105 with one sampling capacitor 107 and associated switches, but in some implementations there may be a plurality of sampling capacitors, each charged during the sampling phase to a respective voltage based on a different bit of the input data D and then connected together in parallel during the read-out phase.

The DACs 105p and 105n provide digital to analogue conversion from the digital input data D. However, as will be understood by one skilled in the art, a DCT DAC is a passive settling DAC and cannot, on its own, provide current to the outputs. The DAC amplifier 106, which may typically be implemented as multi-stage, e.g. two stage, amplifier, thus provides current to the DAC outputs and acts to regulate the DAC outputs. The headphone amplifier 103, which also may typically be implemented as a multi-stage, e.g. two-stage, amplifier, essentially acts as a power amplifier and buffers the output of the DAC circuit 102 to provide the output driving signals to the load 101.

Note that FIGS. 1a and 1b illustrate the DAC circuit 102 and driver amplifier 103 as differential-input and differential-output components, but the driver circuitry could instead comprise two separate DACs driving respective ground-referenced headphone amplifiers to provide the differential output signals to the load.

In this circuit arrangement of FIG. 1b, the output nodes of the DAC circuit 102 are high impedance. The DAC amplifier 106 thus drives high impedance outputs and the inputs for the driver amplifier 103 are virtual earths. The DAC circuit 102 operates effectively with a fixed gain. The DAC amplifier 106 can thus be optimised for good DAC performance, whilst the driver amplifier 103 can be separately optimised for driving the load 101.

The conventional driver circuitry illustrated in FIGS. 1a and 1b thus uses two separate and distinct amplifiers in the audio signal paths, i.e. there is a DAC amplifier and a separate driver amplifier acting on each of the component signal paths, e.g. the positive and negative signal paths, each separately optimised to provide good performance.

As noted above, in some applications the size and/or power consumption of the driver circuitry may be important considerations, for example for wireless in-ear headphones or earbuds or the like where there are limitations on space.

Embodiments of the present disclosure relate to driver circuitry suitable for driving a bridge-tied-load which may be a low impedance load, e.g. with a load impedance of 64 ohms or less, that avoids having a separate DAC and driver amplifier in each component signal path. This can offer advantages in terms of reduced circuit area and/or reduced power consumption compared to the conventional driver circuitry.

Figure 2:
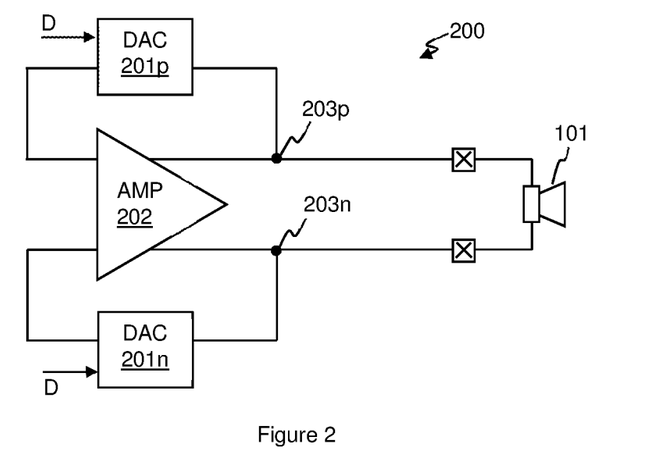
FIG. 2 illustrates a driver circuit according to an embodiment.

FIG. 2 illustrates a driver circuit 200 according to an embodiment. The driver circuit 200 comprises a differential-output DAC circuit configured to generate driving signals suitable for driving a bridge-tied-load 101 without requiring a separate downstream driver amplifier. The load 101 may be a relatively low impedance transducer load, such as a relatively low impedance loudspeaker for example. In some embodiments the transducer load may have an impedance of 650 ohms or less, or 200 ohms or less. In some embodiments the transducer load may have an impedance of 64 ohms or less.

FIG. 2 illustrates DACs 201p and 201n configured to generate respective differential analogue outputs based on the input data D. The DACs 201p and 201n (which may be referred to individually or collectively by the reference 201) may be implemented as passive DACs, such as a switched capacitor DCT DAC as discussed with reference to FIG. 1b, although other types of DAC could be implemented. In this example the DACs 201 are connected across differential amplifier arrangement 202, i.e. each of the DACs is connected between a respective input and respective output in the differential amplifier arrangement 202. The differential amplifier arrangement 202 regulates the outputs of the DACs 201p and 201n. In the driver circuit of FIG. 2, the DACs 201p and 201n provide outputs to output nodes 203p and 203n respectively, which are output nodes for the driving signals for driving the load 101. The amplifier 202 thus both regulates the outputs of the DACs and provides the functionality of a driver amplifier to provide driving signals suitable for driving a load impedance load.

The amplifier 202 thus effectively provides the functionality of the output stage of the headphone amplifier 103, but with the performance of the input stage of the DAC amplifier 106, illustrated in FIGS. 1a and 1b. Conventionally one skilled in the art would not have considered such an arrangement for driving a relatively low impedance load and would have considered it necessary to have a DAC for generating analogue signals to be buffered in a separate downstream amplifier stage. In the embodiment of FIG. 2, this is not the case and the DACs 201p and 201n provide outputs to output nodes 203p and 203n which are relatively low impedance nodes and which may be used as outputs for the driving signals to be applied to the load.

The driver circuit 200 of FIG. 2 avoids the need for an additional, separate, driver amplifier for each signal path, e.g. the headphone amplifier 103 of FIGS. 1a and 1b. Omitting the headphone amplifier 103 can provide advantages in terms of reduced circuit area and power consumption compared to the driver circuit of FIGS. 1a and 1b. Also, the amplifier 202 may be operable from a received power supply, e.g. 1.8V say. The driver circuit 200 may thus not require an amplifier power supply 104 such as a charge pump as discussed with reference to FIG. 1a. Omitting the amplifier power supply 104 may additionally or alternatively provide advantages in terms of reduced circuit area and power consumption compared to the driver circuit of FIG. 1a.

The differential amplifier arrangement 202 may typically comprise a multi-stage amplifier, for example with at least an input stage and an output stage acting on each differential path. Some embodiments may include at least one intermediate amplifier stage, although to keep circuit area and power consumption low, in some embodiments the differential amplifier arrangement 202 may comprise a two-stage amplifier arrangement, i.e. with just two amplifier stages for each differential path. In some embodiments the driver circuitry may comprise at most two amplifier stages acting on each differential signal path. It will be understood however that all amplification stages of such a multi-stage amplifier are configured to act on the relevant differential signal path upstream of the relevant output node 203p or 203n which receives the output of the relevant DAC 201p or 201n. In other words, a signal path between the relevant output node 203p and 203n and the load may not contain any amplification stages. This is different to the arrangement illustrated in FIGS. 1a and 1b where the amplifier stages of the driver amplifier 103 act on the signal paths downstream of the DAC outputs.

The differential amplifier arrangement 202 may be implemented in a number of ways.

Figure 3:
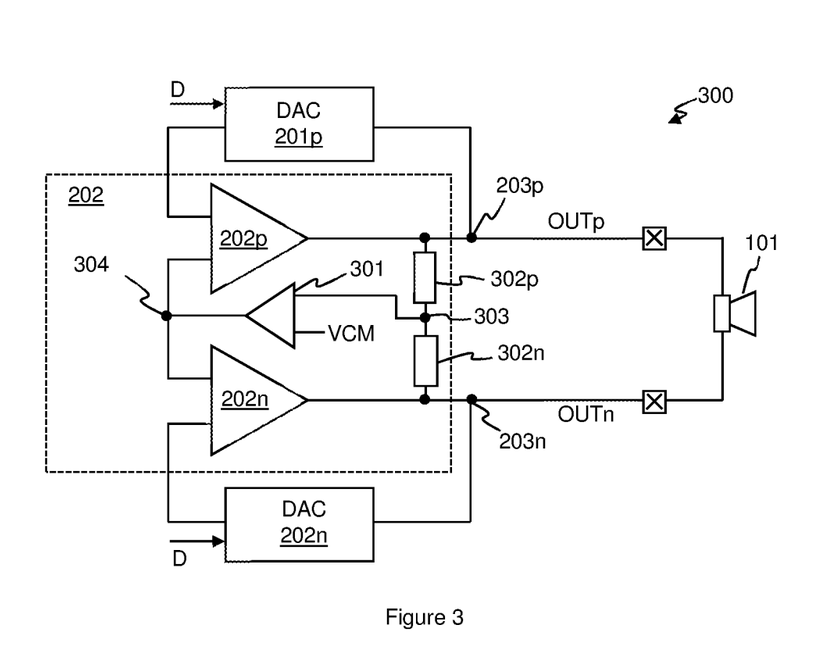
FIG. 3 illustrates an example of a driver circuit according to an embodiment with active regulation of the common-mode voltage in a pseudo-differential circuit.

FIG. 3 illustrates one embodiment. FIG. 3 illustrates that the differential amplifier arrangement 202 may be implemented by a circuit comprising respective amplifiers 202p and 202n in each of the differential paths, i.e. a positive path for providing an output OUTp and a negative path for providing an output OUTn. As noted above it will be understood that the amplifiers 202p and 202n may typically be multi-stage amplifiers, for instance two stage amplifiers.

The differential amplifier arrangement 202 also includes a common-mode regulating amplifier 301 for regulating the common-mode voltage of the amplifier arrangement 202. The common-mode regulating amplifier 301 receives an indication of the common-mode voltage of the output signals OUTp and OUTn. In the example of FIG. 3, the outputs of amplifiers 202p and 2020n are coupled via resistors 302p and 302n of equal resistance, so that the voltage at a midpoint node 303 is equal to the common-mode voltage of the output signals OUTp and OUTn, however there would be other ways to monitor the common mode voltage. This indication of the common-mode voltage is input to the common-mode regulating amplifier 301, which also receives a defined voltage VCM for defining the desired common-mode voltage. Regulating amplifier 301 thus drives a common input node 304, which provides an input to each of amplifiers 202p and 202n, such that the common-mode voltage at the monitored node 303 is equal to the defined voltage VCM.

This arrangement provides stabilization of the common-mode voltage of the output signals OUTp, OUTn, but requires common-mode regulating amplifier 301 to provide active regulation of the common-mode voltage. In some embodiments the common-mode regulating amplifier 301 may not be present, i.e. may be omitted, in order to reduce the circuit area and/or power consumption even further.

Figure 4:
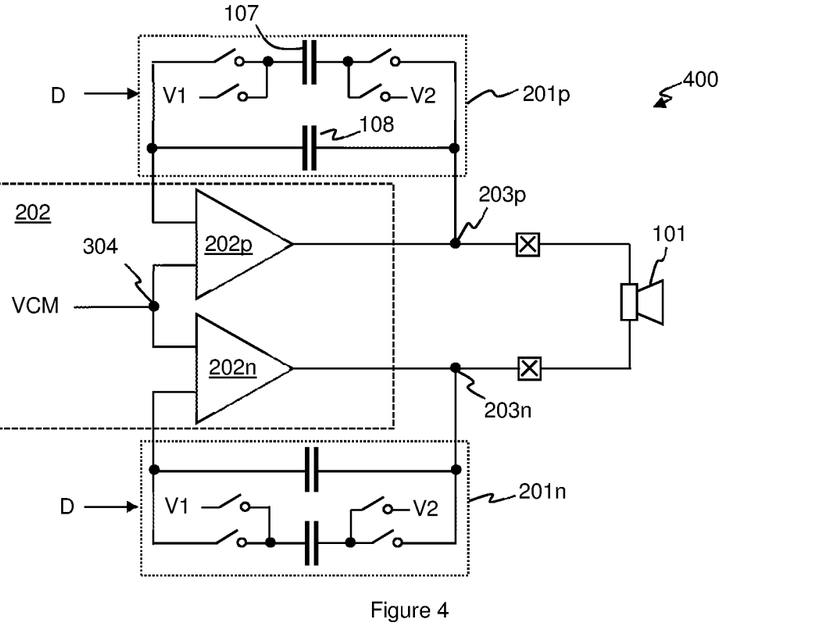
FIG. 4 illustrates a driver circuit according to another embodiment.

FIG. 4 illustrates another embodiment of a driver circuit according to the present disclosure. In this embodiment the differential amplifier arrangement 202 comprises respective amplifiers 202p and 202n acting on the differential signal paths. In this example the amplifiers 202p and 202n may be implemented as separate amplifiers in a pseudo-differential arrangement, with the defined voltage VCM being supplied directly to the common-input node 304. In the pseudo-differential arrangement, the amplifiers 202p and 202n may be tightly coupled in circuit layout and share bias circuitry and the like and will collectively require approximately the same circuit area as a fully differential equivalent. Again, it will be understood that the amplifiers 202p and 202n will typically be implemented as multi-stage amplifiers with at least an input stage and an output stage and may, in some embodiments be implemented as two stage amplifiers, i.e. with just an input stage and an output stage so that there are at most two amplifier stages acting on a differential signal path.

In the example of FIG. 4 the DACs 201p and 201n are illustrated as DCT DACs with one or more sampling capacitors 107, each with associated switches, and integrating capacitor 108, in a similar manner as discussed with respect to FIG. 1b. Again, it will be understood that the DACs could be implemented with more than one sampling capacitor 107. It will be seen that the voltages stored on the sampling capacitor(s) in the sampling phase are combined to provide an overall voltage on the integrating capacitor 108 in the read-out phase and this voltage is applied to the relevant output node 203p or 203n, and there are no downstream amplification stages in the respective signals paths. Again, it will be noted that whilst a switched capacitor DCT DAC may be used in embodiments of the present invention other types of passive DACs could be implemented in other examples.

The driver circuit of FIG. 4 omits the regulating amplifier 301 of FIG. 3, and thus avoids the associated circuit area and power consumption associated with the regulating amplifier 301.

However, the driver circuits of embodiments of the present invention are intended to be suitable for driving low-impedance loads with differential driving signals. The gain for the output stage of the amplifiers 202p and 202n will be limited by the output resistance. The gain typically varies with the transconductance, $g_m$, of the output stage and the effective load resistance R as $g_m \times R$, as will be understood by one skilled in the art. For a differential component of the driving signals, the differential voltage will be applied across the load 101 and thus the effective output resistance will be the load resistance. Given the driver circuit is driving a relatively low impedance load, the gain for the differential signals is thus limited. This may particularly be the case for driving loads with impedances of the order of 64 ohms or less.

For any common-mode component of the output signals, however, the common-mode component is present in both driving signals applied to the load 101. Thus, the common-mode component results in no significant voltage difference across the load and hence no significant current through the load. In other words, the load is effectively not seen by the common-mode component. The effective output resistance for the output of the DAC amplifiers for the common-mode component is high as the resistance from the output to ground is very high (in theory infinity but, in practice will be set by the parasitic elements of the circuit). This result in a large gain for the common-mode component, which means that any perturbation that appears on both DAC amplifier outputs, i.e. as a common-mode component, for instance any noise or voltages due to mismatch and/or parasitics, may cause undesired oscillation. The driver circuit 400 of FIG. 4 may therefore suffer from stability issues in the presence of any significant common-mode signal component.

Figure 5:
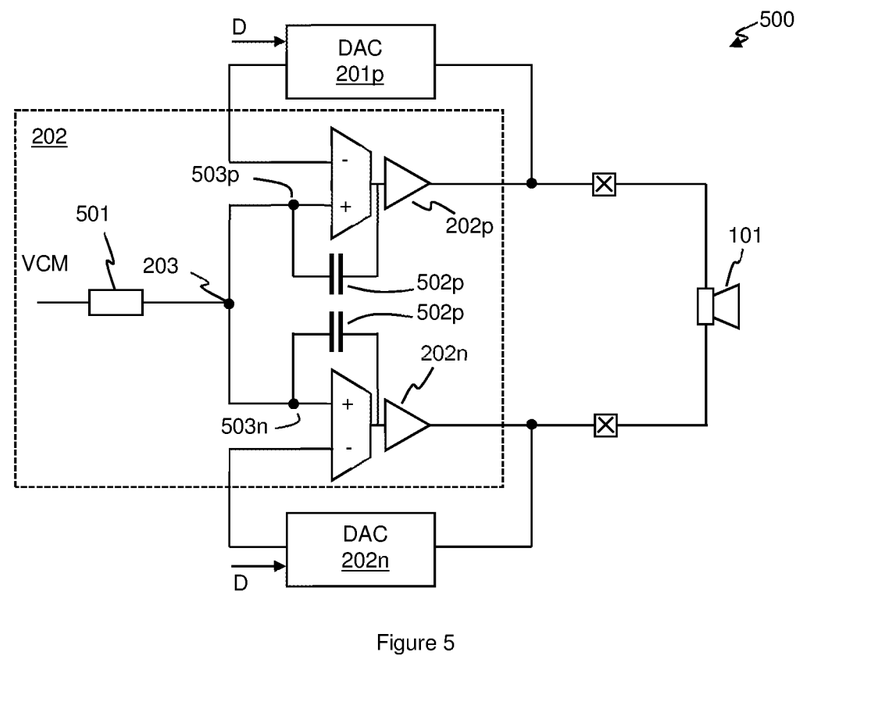
FIG. 5 illustrates a driver circuit according to another embodiment with compensation for common mode variations.

FIG. 5 illustrates a further example of a driver circuit according to an embodiment, which includes some compensation circuitry for compensating for any variation in the common-mode voltage. In this embodiment the differential amplifier arrangement 202 again comprises respective amplifiers 202p and 202n acting on the differential signal paths, which may be implemented as separate amplifiers in a pseudo-differential arrangement. The amplifiers 202p and 202n may, as discussed with reference to FIG. 4, be tightly coupled in circuit layout and may share biasing circuitry and the like. FIG. 5 explicitly illustrates the amplifiers 202p and 202n as multi-stage amplifiers, in this example two-stage amplifiers having an input stage and output stage.

In the driver circuit 500, the defined voltage VCM is applied to the common input 203 via a series resistance 501. In addition, the driver circuit 500 includes feedback, via feedback impedances 502p and 502n, from the signal path of the amplifiers 202p and 202n to the input for receiving the defined common-mode voltage VCM.

In the example of FIG. 5, the feedback impedances 502p and 502n are reactive components and comprise capacitors, which are coupled in a feedback path between a tap node of the amplifiers 202p and 202n and the respective input nodes 503p and 503n of the respective amplifier which is coupled to the common input node 203. In other implementations the feedback impedances could additionally or alternatively include other impedances, at least some of which could be reactive components such as capacitors or inductors.

The feedback impedances 502p and 502n provide feedback from the signal path of the relevant DAC amplifier to the respective input nodes 503p and 503n, and hence to the common input node 203.

The feedback impedances 502p and 502n may be coupled to any suitable tap node of the respective DAC amplifier 202p or 202n that varies with the output signal, e.g. any signal path node. The tap node could be located at the amplifier output, but for ease of processing the tap node could be located upstream of the output stage and, in the example of FIG. 5, may be a signal node which is between the input stage and the output stage of the respective DAC amplifier 202p or 202n.

The feedback via feedback impedances 502p and 502n provides compensation for variations in the common-mode voltage without any significant impact on the differential signal components.

If there is any disturbance or perturbation of the common-mode voltage of the outputs, the voltage in the signal paths of DAC amplifiers 202p and 202n will move in the same direction as one another. Due to the coupling of signal paths of the DAC amplifiers to the common input node 203 via feedback impedances 502p and 502n, and the series resistance 501 between the defined voltage and the common input node 203, the voltage at the common input node will exhibit a corresponding movement. This will adjust the drive strength applied from the common input node to the respective inputs of the amplifiers 202p and 202n, which can limit the gain for the common-mode component and increase stability.

Any differential component of the signal paths of the DAC amplifiers 202*p* and 202*n* will exhibit equal and opposite variations in voltage and the coupling via feedback impedances 502*p* and 502*n* to the common input node 203 will thus effectively cancel. Thus, the presence of feedback impedances 502*p* and 502*n* will have no significant impact on the differential signal component of interest.

The driver circuit 500 thus connects the amplifiers 202*p* and 202*p* together such that common mode signal variations are filtered, thus attenuating their gain and maintaining stability of the amplifier arrangement 202, whilst ensuring that differential signals are substantially unaffected. In the example of FIG. 5 the feedback via feedback impedances 502*p* and 502*n*, i.e. the capacitances in this example, will be equal and opposite for a differential signal, thus cancelling out and having no substantial effect. The feedback for a common-mode signal will, however, be in phase, and will modulate the input via negative feedback.

The driver circuit of FIG. 5 thus mitigates the issues of a high gain for common-mode signal components and provides stability for the driver circuit. The use of a passive components such as feedback impedances 502*p* and 502*n* and series resistance 501 does not add any significant power consumption, and the passive components can be implemented in a relatively small circuit area. The driver circuit 500 illustrated in FIG. 5 thus may have reduced power consumption and circuit area than that illustrated in FIG. 3, as it does not include the common-mode regulating amplifier 301 for active regulation of the common-mode voltage, and instead provides passive regulation.

Figure 6:
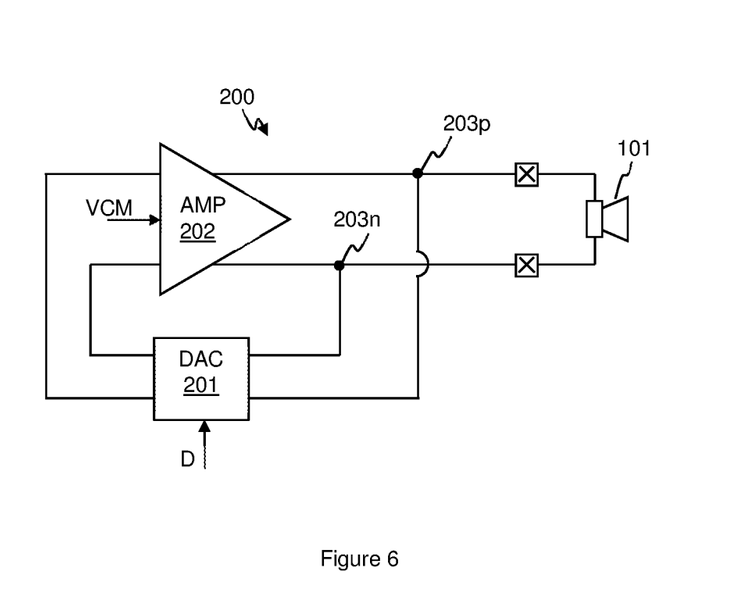
FIG. 6 illustrates another example of a driver circuit according to an embodiment.

It will be noted that the discussion above has discussed separate DACs 201*p* and 201*n* for the respective signal paths of the differential output. These DACs could be implemented as separate DAC or could be seen as, or implemented as, a differential output DAC arrangement, such as illustrated in FIG. 6. The reference to first and second DACs, as used herein, is intended to cover separate implementations or a differential configuration.

Embodiments of the present disclosure thus relate to driver circuitry, for receiving an input digital signal and for outputting, at first and second output nodes, respective first and second analogue driving signals for driving a low impedance, bridge-tied-load.

The driving circuitry comprises first and second DACs configured to receive the digital input signal, where the outputs of the first and second DACs are coupled to first and second output nodes respectively. A differential-output amplifier circuit with outputs connected to the first and second output nodes is configured to regulate the DAC output at the first and second output nodes to provide the first and second analogue driving signals. The differential-output amplifier circuit may comprise first and second amplifiers, which may be coupled in a pseudo-differential configuration.

Some embodiments relate to circuitry for driving a load, in particular a transducer, that comprises an amplifier having differential input terminals for receiving a differential analogue input signal and differential output terminals for outputting a differential analogue output signal for driving the transducer. A switched capacitor DAC arrangement, having an input terminal for receiving a digital input signal, is operatively connected between the amplifier differential input and output terminals.

Embodiments of the present disclosure thus provide driver circuitry for driving low impedance bridge-tied-loads, in particular low impedance transducers such as relatively small loudspeakers. The driver circuits according to embodiments can be implemented with a relatively small circuit area and/or with a relative low power consumption, and thus may be advantageous for applications where space and/or power consumption is important.

Embodiments are particularly applicable to audio driver circuitry, e.g. for driving low impedance loudspeakers, and may be advantageous when implemented in wireless earbuds or in-ear headphones of the like. Note that as used herein the term audio shall be taken to include driving a transducer to generate audible sounds that could be heard by a listener, but shall also include driving signals at other frequencies, e.g. at ultrasonic frequencies for other applications, such as machine to machine communication or proximity or gesture sensing or the like. The principles may also be applied to driving other transducers than loudspeakers, such as transducers for haptic output, e.g. linear resonant actuators or similar.

Embodiments may be arranged as part of an audio and/or signal processing circuit, for instance an audio circuit which may be provided in a host device. A circuit according to an embodiment of the present invention may be implemented as an integrated circuit.

Embodiments may be incorporated in a host electronic device, which may for example be a portable device and/or a device operable with battery power. The host device could be an audio device such as a headphone or headset, which could be an in-ear headphone or earbud or similar. The host device may include a wireless communication module for receiving input data. The host device could be a communication device such as a mobile telephone or smartphone or similar, a computing device such as notebook, laptop or tablet computing device, a wearable device such as a smartwatch or the host device could be an accessory device for use with any such device. The host device could be a device with voice control or activation functionality.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units

The invention claimed is:

1. Driver circuitry for receiving a digital input signal and outputting, at first and second output nodes, first and second analogue driving signals respectively for driving a bridge-tied-load, the driver circuitry comprising:
first and second digital-to-analogue converters configured to receive the digital input signal, wherein outputs of the first and second digital-to-analogue converters are coupled to the first and second output nodes respectively;
a differential-output amplifier circuit having outputs connected to the first and second output nodes respectively, wherein the differential-output amplifier circuit is configured to regulate the outputs of first and second digital-to-analogue converters at the first and second output nodes to provide the first and second analogue driving signals;
wherein:
the differential-output amplifier circuit comprises first and second amplifiers with respective outputs coupled to the first and second output nodes respectively and wherein a first input of the first amplifier and first input of the second amplifier are coupled to a common-input node, the common input node being configured to receive a voltage based on a defined common-mode voltage; and
wherein the common input node is coupled to the defined common-mode voltage via a series resistance in order to receive the defined common-mode voltage.

2. Driver circuitry as claimed in claim 1 wherein the first and second digital-to-analogue converters are connected across the first and second amplifiers respectively between a second input of the respective first or second DAC amplifier and the output of the respective first or second DAC amplifier.

3. Driver circuitry as claimed in claim 1 further comprising, for each of the first and second amplifiers, a feedback impedance in a feedback path from a tap node of a signal path of the relevant amplifier and the first input of the amplifier.

4. Driver circuitry as claimed in claim 3 wherein the tap node of the signal path is upstream of an output stage of the amplifier.

5. Driver circuitry as claimed in claim 3 wherein the feedback impedance comprises at least one reactive component.

6. Driver circuitry as claimed in claim 3 wherein the feedback impedance comprises a capacitor.

7. Driver circuitry as claimed in claim 1 where the first and second digital-to-analogue converters comprise switched capacitor direct-charge-transfer DACs.

8. Driver circuitry as claimed in claim 1 wherein the differential-output amplifier circuit comprises a two-stage amplifier.

9. Driver circuitry as claimed in claim 1 wherein the first and second analogue driving signals are for driving a bridge-tied-load transducer with an impedance or 1000 ohms or less, or 650 ohms or less, or 200 ohms or less.

10. Driver circuitry as claimed in claim 1 wherein the first and second analogue driving signals are for driving a bridge-tied-load transducer with an impedance or 64 ohms or less.

11. Driver circuitry as claimed in claim 1 implemented as an integrated circuit.

12. Driver circuitry as claimed in claim 1 further comprising a transducer load coupled in series between the first and second output nodes.

13. Driver circuitry as claimed in claim 12 wherein the transducer load is a loudspeaker.

14. Driver circuitry as claimed in claim 12 wherein there are no amplification stages in signal paths between the first and second output nodes and the transducer load.

15. An electronic device comprising driver circuitry as claimed in claim 1.

16. Driver circuitry for receiving a digital input signal and outputting, at first and second output nodes, first and second analogue driving signals respectively for driving a bridge-tied-load, the driver circuitry comprising:
- first and second digital-to-analogue converters configured to receive the digital input signal, wherein outputs of the first and second digital-to-analogue converters are coupled to the first and second output nodes respectively;
- a differential-output amplifier circuit having outputs connected to the first and second output nodes respectively, wherein the differential-output amplifier circuit is configured to regulate the outputs of first and second digital-to-analogue converters at the first and second output nodes to provide the first and second analogue driving signals; and
- a common-mode regulating amplifier having a first input coupled to receive the defined common-mode voltage, a second input coupled to receive an indication of the common-mode voltage at the first and second output nodes and an output coupled to the common input node;

wherein the differential-output amplifier circuit comprises first and second amplifiers with respective outputs coupled to the first and second output nodes respectively and wherein a first input of the first amplifier and first input of the second amplifier are coupled to a common-input node, the common input node being configured to receive a voltage based on a defined common-mode voltage.

* * * * *

UNITED STATES PATENT AND TRADEMARK OFFICE
CERTIFICATE OF CORRECTION

PATENT NO. : 11,483,654 B2
APPLICATION NO. : 17/158540
DATED : October 25, 2022
INVENTOR(S) : Howlett et al.

It is certified that error appears in the above-identified patent and that said Letters Patent is hereby corrected as shown below:

In the Claims

1. In Column 12, Line 49, in Claim 7, delete "where the" and insert -- wherein the --, therefor.

2. In Column 12, Line 57, in Claim 9, delete "impedance or" and insert -- impedance of --, therefor.

3. In Column 12, Line 61, in Claim 10, delete "impedance or" and insert -- impedance of --, therefor.

4. In Column 14, Line 6, in Claim 16, delete "the defined common-mode voltage," and insert -- a defined common-mode voltage, --, therefor.

5. In Column 14, Lines 17-18, in Claim 16, delete "a defined common-mode voltage." and insert -- the defined common-mode voltage. --, therefor.

Signed and Sealed this
Fourteenth Day of February, 2023

Katherine Kelly Vidal
*Director of the United States Patent and Trademark Office*